United States Patent
Li et al.

(10) Patent No.: US 10,574,401 B2
(45) Date of Patent: Feb. 25, 2020

(54) POLAR CODE RETRANSMISSION METHOD AND APPARATUS

(71) Applicant: Huawei Technologies Co., Ltd., Shenzhen, Guangdong (CN)

(72) Inventors: Rong Li, Hangzhou (CN); Guijie Wang, Hangzhou (CN); Gongzheng Zhang, Hangzhou (CN); Jian Wang, Hangzhou (CN); Jun Wang, Hangzhou (CN)

(73) Assignee: HUAWEI TECHNOLOGIES CO., LTD., Shenzhen, Guangdong (CN)

(*) Notice: Subject to any disclaimer, the term of this patent is extended or adjusted under 35 U.S.C. 154(b) by 0 days.

(21) Appl. No.: 16/298,901

(22) Filed: Mar. 11, 2019

(65) Prior Publication Data

US 2019/0207720 A1    Jul. 4, 2019

Related U.S. Application Data

(63) Continuation of application No. PCT/CN2017/095827, filed on Aug. 3, 2017.

(30) Foreign Application Priority Data

Sep. 12, 2016 (CN) .......................... 2016 1 0819549

(51) Int. Cl.
| | |
|---|---|
| *H04L 1/18* | (2006.01) |
| *H03M 13/13* | (2006.01) |
| *H04L 1/00* | (2006.01) |

(52) U.S. Cl.
CPC .......... *H04L 1/1825* (2013.01); *H03M 13/13* (2013.01); *H04L 1/0041* (2013.01);
(Continued)

(58) Field of Classification Search
CPC ... H04L 1/1825; H04L 1/0041; H04L 1/0057; H04L 1/1819; H04L 1/1867; H04L 1/1812; H03M 13/13
See application file for complete search history.

(56) References Cited

U.S. PATENT DOCUMENTS

| | | | |
|---|---|---|---|
| 2014/0016571 A1 | 1/2014 | Yucek et al. | |
| 2015/0026543 A1* | 1/2015 | Li ........................ | H03M 13/13 714/776 |

(Continued)

FOREIGN PATENT DOCUMENTS

| | | |
|---|---|---|
| CN | 102122966 A | 7/2011 |
| CN | 102164025 A | 8/2011 |

(Continued)

OTHER PUBLICATIONS

Bin Li et al.,"Capacity-Achieving Rateless Polar Codes",arXiv:1508.03112v1 [cs.IT] Aug. 13, 2015,total 14 pages.

*Primary Examiner* — Kenneth T Lam
(74) *Attorney, Agent, or Firm* — Womble Bond Dickinson (US) LLP

(57) ABSTRACT

Embodiments of this application provide a polar code retransmission method and apparatus, to reduce retransmission complexity and improve transmission performance. The method includes: determining a first polar channel sequence including N polar channels and reliability of each of the N polar channels; determining, based on a coding parameter for an $m^{th}$ data transmission, a quantity $K_m$ of information bits that need to be transmitted during the $m^{th}$ data transmission, where the coding parameter includes at least one of the quantity of information bits and a code rate; determining $K_m$ polar channels with highest reliability in the first polar channel sequence; determining $K_m$ information bits based on locations, of information bits that need to be transmitted during first m−1 data transmissions, in the first (Continued)

polar channel sequence; and mapping the $K_m$ information bits to the $K_m$ polar channels for transmission.

20 Claims, 8 Drawing Sheets

(52) U.S. Cl.
CPC .......... *H04L 1/0057* (2013.01); *H04L 1/1819* (2013.01); *H04L 1/1867* (2013.01)

(56) References Cited

U.S. PATENT DOCUMENTS

| | | | |
|---|---|---|---|
| 2015/0103947 A1* | 4/2015 | Shen | H04B 1/04 |
| | | | 375/295 |
| 2016/0285479 A1* | 9/2016 | El-Khamy | H03M 13/6368 |
| 2017/0047947 A1* | 2/2017 | Hong | H03M 13/2906 |
| 2017/0111060 A1* | 4/2017 | Huang | H03M 13/13 |
| 2017/0181104 A1* | 6/2017 | Jang | H03M 13/13 |
| 2017/0338996 A1* | 11/2017 | Sankar | H04L 27/20 |
| 2018/0262214 A1* | 9/2018 | Hui | H03M 13/3784 |
| 2019/0052418 A1* | 2/2019 | Li | H04L 1/1819 |
| 2019/0140663 A1* | 5/2019 | Noh | H04L 1/00 |
| 2019/0199480 A1* | 6/2019 | Kim | H04L 1/18 |

FOREIGN PATENT DOCUMENTS

| | | |
|---|---|---|
| CN | 102694625 A | 9/2012 |
| CN | 103281166 A | 9/2013 |
| CN | 104243106 A | 12/2014 |
| CN | 105743621 A | 7/2016 |

\* cited by examiner

POLAR CODE RETRANSMISSION METHOD AND APPARATUS

CROSS-REFERENCE TO RELATED APPLICATIONS

This application is a continuation application of International Application No. PCT/CN2017/095827 filed on Aug. 3, 2017, which claims priority to Chinese Patent Application No. 201610819549.2, filed on Sep. 12, 2016. The disclosures of the aforementioned applications are hereby incorporated by reference in their entireties.

TECHNICAL FIELD

This application relates to the communications field, and more specifically, to a polar code retransmission method and apparatus.

BACKGROUND

In a communications system, usually data transmission reliability is improved through channel encoding, to ensure communication quality. A polar code (polar code) is an encoding manner that can achieve a Shannon capacity and that has low encoding and decoding complexity. The polar code is a linear block code. A generation matrix of the polar code is $G_N$, and an encoding process of the polar code is $x_1^N = u_1^N G_N$, where $u_1^N = (u_1, u_2, \ldots, u_N)$ is a binary row vector, $G_N = B_N F_2^{\otimes(log_2(N))}$, a code length $N=2^n$, and $n \geq 0$.

$$F_2 = \begin{bmatrix} 1 & 0 \\ 1 & 1 \end{bmatrix},$$

and $B_N$ is an N×N transposed matrix, such as a bit reversal matrix. $F_2^{\otimes(log_2(N))}$ is a Kronecker power of $F_2$, and is defined as $F^{\otimes(log_2(N))} = F \otimes F^{\otimes((log_2(N))-1)}$.

In the encoding process of the polar code, some bits in $u_1^N$ are used to carry information and are referred to as information bits, and a sequence number set of these information bits is denoted as A. The other bits are set to fixed values that are agreed on by a transmit end and a receive end in advance and are referred to as fixed bits, and a sequence number set of these bits is represented by using a complementary set $A^c$ of A. Without loss of generality, these fixed bits are usually set to 0. Actually, a fixed bit sequence may be randomly set provided that the transmit end and the receive end agree in advance. Therefore, an encoded bit sequence of the polar code may be obtained by using the following method: $x_1^N = u_A G_N(A)$, where $u_1^N$ is an information bit set in $u_1^N$, and $u_A$ is a row vector of a length K, in other words, |A|=K, |•| indicates a quantity of elements in the set, and K indicates a quantity of elements in the set A and also indicates a quantity of to-be-encoded information bits; and $G_N(A)$ is a submatrix that is in the matrix $G_N$ and that is obtained based on rows corresponding to indexes in the set A, and $G_N(A)$ is a K×N matrix. Selection of the set A determines performance of the polar code.

In communications application that is insensitive to a system latency, a hybrid automatic repeat request (HARQ) is a commonly used transmission method for improving a system throughput. When transmitting an information block, a transmit device encodes the information block and sends the encoded information block to a channel. If a receive device decodes a received signal and finds that transmission succeeds, the receive device sends an acknowledgement (ACK) message to the transmit device, so as to complete the transmission of the information block. If the receive device decodes a received signal and finds that transmission fails (for example, cyclic redundancy check fails), the receive device transmits a negative acknowledgement (NACK) message to the transmit device through a feedback link, and the transmit device retransmits the information block. Alternatively, when no ACK feedback sent by the receive device is received within a specific period of time, the transmit device also retransmits the information block. This process continues until the receive device correctly performs decoding. To obtain a maximum link throughput, the receive device temporarily stores all received signals and decodes the received signals together with a newly received signal.

In an existing retransmission method, reliability of a polar channel needs to be recalculated based on a current code rate during each retransmission, and complexity is excessively high.

SUMMARY

In view of the above, embodiments of this application provide a polar code (polar code) retransmission method, to reduce retransmission complexity and improve transmission performance.

According to a first aspect, a polar code retransmission method is provided, including: determining a first polar channel sequence including N polar channels and reliability of each of the N polar channels; determining, based on a coding parameter for an $m^{th}$ data transmission, a quantity $K_m$ of information bits that need to be transmitted during the $m^{th}$ data transmission, where the coding parameter includes at least one of the quantity of information bits and a code rate; determining $K_m$ polar channels with highest reliability in the first polar channel sequence; determining $K_m$ information bits based on locations, of information bits that need to be transmitted during first m−1 data transmissions, in the first polar channel sequence; and mapping the $K_m$ information bits to the $K_m$ polar channels for transmission, where m, $K_m$, and N are positive integers, m is greater than 1, and $K_m$ is less than N.

Specifically, a transmit device may determine the first polar channel sequence based on the reliability of each of the N polar channels, and adjust information bits based on the first polar channel sequence during each subsequent data transmission. In addition, before each data transmission, the transmit device first needs to determine a coding parameter for this data transmission. It should be understood that the coding parameter may include at least one of the following parameters: a code length (which may also be referred to as a quantity of encoded bits), a quantity of information bits, and a code rate. After determining the coding parameter for this transmission, the transmit device determines, based on the coding parameter, a quantity $K_m$ of information bits that need to be transmitted, and then selects corresponding $K_m$ polar channels and $K_m$ information bits to perform mapping and transmission. In this embodiment of this application, when performing the $m^{th}$ data transmission, the transmit device determines $K_m$ information bits used for the $m^{th}$ data transmission, and maps the $K_m$ information bits to $K_m$ polar channels with highest reliability for encoding and transmission.

Therefore, according to the polar code retransmission method in this embodiment of this application, the same polar channel sequence is used during each data transmission, and the determined $K_m$ information bits are directly mapped to the $K_m$ polar channels with highest reliability in the polar channel sequence for transmission, without recalculating the reliability of the polar channels before each retransmission. This can reduce retransmission complexity and improve transmission performance, thereby improving user experience.

It should be understood that the reliability of the polar channels may be calculated through density evolution (DE) or Gaussian approximation (GA).

In a first possible implementation of the first aspect, m is 2, and the $K_m$ information bits are information bits that occupy $K_m$ polar channels with lowest reliability in the first polar channel sequence during a first data transmission.

Specifically, during a retransmission, the transmit device may select information bits transmitted on polar channels with lowest reliability during the first data transmission, and select $K_m$ information bits with lowest reliability that are corresponding to the polar channels to perform the retransmission. In this way, a decoding success rate of a receive device can be increased, and a quantity of retransmissions of the transmit device can be reduced.

With reference to the foregoing possible implementation of the first aspect, in a second possible implementation of the first aspect, a code rate of the first data transmission is R, and a code rate of the $m^{th}$ data transmission is $$\frac{R}{m},$$

where R is greater than 0 and less than 1; and the determining $K_m$ information bits based on locations, of information bits that need to be transmitted during first m−1 data transmissions, in the first polar channel sequence includes: determining $K_{m-1}$ polar channels, corresponding to information bits that need to be transmitted during an $(m-1)^{th}$ data transmission, in the first polar channel sequence, where $K_{m-1}$ is less than N and greater than $K_m$; determining $$\left\lceil \frac{K_m}{m-1} \right\rceil$$

polar channels with lowest reliability from the $K_{m-1}$ polar channels; and determining the $K_m$ information bits from information bits on the $$\left\lceil \frac{K_m}{m-1} \right\rceil$$

polar channels during each of the first m−1 data transmissions.

Specifically, before performing the $m^{th}$ data transmission, the transmit device may first determine the $$\left\lceil \frac{K_m}{m-1} \right\rceil$$

polar channels, with lowest reliability corresponding to the information bits that need to be transmitted during the $(m-1)^{th}$ data transmission, in the first polar channel sequence, and then select the $K_m$ information bits from information bits mapped to the $$\left\lceil \frac{K_m}{m-1} \right\rceil$$

polar channels during each of the first m−1 data transmissions, to perform the $m^{th}$ data transmission.

Therefore, information bits corresponding to most unreliable polar channels during all previous data transmissions are comprehensively considered, and the information bits are mapped to $K_m$ polar channels with highest reliability for retransmission, so as to enhance reliability of these most unreliable information bits, and increase a decoding success rate.

With reference to the foregoing possible implementations of the first aspect, in a third possible implementation of the first aspect, the mapping the $K_m$ information bits to the $K_m$ polar channels for transmission includes: sorting the $K_m$ information bits in descending order of reliability of the polar channels corresponding to the $K_m$ information bits that need to be transmitted during the first data transmission; and mapping, for transmission, the sorted $K_m$ information bits to the $K_m$ polar channels ranked in descending order of reliability.

Specifically, during each retransmission, the $K_m$ information bits may be mapped, in descending order of the reliability of the polar channels occupied by the $K_m$ information bits during the first data transmission, to the $K_m$ polar channels ranked in descending order of reliability.

With reference to the foregoing possible implementations of the first aspect, in a fourth possible implementation of the first aspect, before the determining, based on a coding parameter for an $m^{th}$ data transmission, a quantity $K_m$ of information bits that need to be transmitted during the $m^{th}$ data transmission, the method further includes: determining the coding parameter for the $m^{th}$ data transmission.

Specifically, the transmit device may determine the coding parameter for the $m^{th}$ data transmission in a plurality of manners. Specifically, the coding parameter may be agreed on by the transmit device and the receive device in advance, or may be determined by the transmit device based on feedback information from the receive device before each retransmission. This is not limited in this embodiment of this application.

With reference to the foregoing possible implementations of the first aspect, in a fifth possible implementation of the first aspect, the determining the coding parameter for the $m^{th}$ data transmission includes: determining a preset coding parameter as the coding parameter for the $m^{th}$ data transmission.

In a specific implementation, a code rate of an initial transmission may be R, a code rate of a second transmission is $$\frac{R}{2},$$

a code rate of a third transmission is $$\frac{R}{3},$$

..., and a code rate of the $m^{th}$ transmission is $$\frac{R}{m}.$$

With reference to the foregoing possible implementations of the first aspect, in a sixth possible implementation of the first aspect, the determining the coding parameter for the $m^{th}$ data transmission includes: receiving feedback information sent by a receive device for the $(m-1)^{th}$ data transmission; and determining the coding parameter for the $m^{th}$ data transmission based on the feedback information for the $(m-1)^{th}$ data transmission.

In this way, the transmit device can adjust, by using the feedback information sent by the receive device, a coding parameter such as a code rate, a code length, or a quantity of information bits, so as to adaptively change a code rate during a retransmission.

With reference to the foregoing possible implementations of the first aspect, in a seventh possible implementation of the first aspect, the first polar channel sequence is generated by sorting the N polar channels based on the reliability of each of the N polar channels.

In this way, the transmit device does not need to determine a reliability value of each of the N polar channels during each transmission, but only needs to obtain the first polar channel sequence obtained after the N polar channels are sorted based on reliability values. This reduces complexity and improves coding efficiency.

With reference to the foregoing possible implementations of the first aspect, in an eighth possible implementation of the first aspect, the reliability of each polar channel is a polarization weight of the polar channel.

With reference to the foregoing possible implementations of the first aspect, in a ninth possible implementation of the first aspect, before the determining a first polar channel sequence including N polar channels and reliability of each of the N polar channels, the method further includes: calculating the polarization weight of each of the N polar channels.

With reference to the foregoing possible implementations of the first aspect, in a tenth possible implementation of the first aspect, the calculating the polarization weight of each of the N polar channels includes: obtaining a first polarization weight vector by calculating the polarization weights $W_i$ of the N polar channels according to the following formula:

$$W_i = \sum_{j=0}^{n-1} B_j * (2^j + \phi)^\alpha,$$

where $i \triangleq B_{n-1}B_{n-2} \ldots B_0$, i is a channel index, $B_{n-1}B_{n-2} \ldots B_0$ is a binary representation of i, $B_{n-1}$ is a most significant bit, $B_0$ is a least significant bit, $B_j \in \{0,1\}$, $j \in \{0, 1, \ldots, n-1\}$, $i \in \{0, 1, \ldots, n-1\}$, $N=2^n$, $\phi$ and $\alpha$ are parameters preset based on a target code length of the first data transmission and a code rate of the first data transmission, and n is a positive integer.

According to a second aspect, a polar code retransmission method is provided, including: determining a first polar channel sequence including N polar channels and reliability of each of the N polar channels; determining, based on a coding parameter for an $m^{th}$ data transmission, a quantity $K_m$ of information bits that need to be transmitted during the $m^{th}$ data transmission, where the coding parameter includes at least one of the quantity of information bits and a code rate; determining $K_m$ polar channels with highest reliability in the first polar channel sequence; and decoding, on the $K_m$ polar channels, data transmitted during the $m^{th}$ data transmission, where m, $K_m$, and N are positive integers, m is greater than 1, and $K_m$ is less than N.

Therefore, according to the polar code retransmission method in this embodiment of this application, during each data transmission, $K_m$ polar channels are directly determined by using the same polar channel sequence, and received data is directly decoded on the $K_m$ polar channels, without recalculating reliability of the polar channels before each reception of data retransmitted by a transmit device. This can reduce decoding complexity and improve transmission performance, thereby improving user experience.

In a first possible implementation of the second aspect, the first polar channel sequence is generated by sorting the N polar channels based on the reliability of each of the N polar channels.

With reference to the foregoing possible implementation of the second aspect, in a second possible implementation of the second aspect, the method further includes: sending feedback information to a transmit device, so that the transmit device determines the coding parameter for the $m^{th}$ data transmission based on the feedback information.

With reference to the foregoing possible implementations of the second aspect, in a third possible implementation of the second aspect, the reliability of each polar channel is a polarization weight of the polar channel.

With reference to the foregoing possible implementations of the second aspect, in a fourth possible implementation of the second aspect, before the determining a first polar channel sequence including N polar channels and reliability of each of the N polar channels, the method further includes: calculating the polarization weight of each of the N polar channels.

With reference to the foregoing possible implementations of the second aspect, in a fifth possible implementation of the second aspect, the calculating the polarization weight of each of the N polar channels includes: obtaining a first polarization weight vector by calculating the polarization weights $W_i$ of the N polar channels according to the following formula:

$$W_i = \sum_{j=0}^{n-1} B_j * (2^j + \phi)^\alpha,$$

where $i \triangleq B_{n-1}B_{n-2} \ldots B_0$, i is a channel index, $B_{n-1}B_{n-2} \ldots B_0$ is a binary representation of i, $B_{n-1}$ is a most significant bit, $B_0$ is a least significant bit, $B_j \in \{0,1\}$, $j \in \{0, 1, \ldots, n-1\}$, $i \in \{0, 1, \ldots, n-1\}$, $N=2^n$, $\phi$ and $\alpha$ are parameters preset based on a target code length of a first data transmission and a code rate of the first data transmission, and n is a positive integer.

According to a third aspect, a polar code retransmission apparatus is provided, configured to perform the method in any one of the first aspect or the possible implementations of the first aspect. Specifically, the apparatus includes units configured to perform the method in any one of the first aspect or the possible implementations of the first aspect.

According to a fourth aspect, a polar code retransmission apparatus is provided, configured to perform the method in any one of the second aspect or the possible implementations of the second aspect. Specifically, the apparatus includes units configured to perform the method in any one of the second aspect or the possible implementations of the second aspect.

According to a fifth aspect, a polar code retransmission apparatus is provided. The apparatus includes a receiver, a transmitter, a memory, a processor, and a bus system. The receiver, the transmitter, the memory, and the processor are connected to each other by using the bus system. The memory is configured to store an instruction. The processor is configured to execute the instruction stored in the memory, to control the receiver to receive a signal and control the transmitter to send a signal. In addition, when the processor executes the instruction stored in the memory, the execution enables the processor to perform the method in any one of the first aspect or the possible implementations of the first aspect.

According to a sixth aspect, a polar code retransmission apparatus is provided. The apparatus includes a receiver, a transmitter, a memory, a processor, and a bus system. The receiver, the transmitter, the memory, and the processor are connected to each other by using the bus system. The memory is configured to store an instruction. The processor is configured to execute the instruction stored in the memory, to control the receiver to receive a signal and control the transmitter to send a signal. In addition, when the processor executes the instruction stored in the memory, the execution enables the processor to perform the method in any one of the second aspect or the possible implementations of the second aspect.

According to a seventh aspect, a polar code retransmission system is provided, where the system includes the apparatus in any one of the third aspect or the possible implementations of the third aspect and the apparatus in any one of the fourth aspect or the possible implementations of the fourth aspect; or the system includes the apparatus in any one of the fifth aspect or the possible implementations of the fifth aspect and the apparatus in any one of the sixth aspect or the possible implementations of the sixth aspect.

According to an eighth aspect, a computer-readable medium is provided, and is configured to store a computer program, and the computer program includes instructions used to perform the method in any one of the first aspect or the possible implementations of the first aspect.

According to a ninth aspect, a computer-readable medium is provided, and is configured to store a computer program, and the computer program includes instructions used to perform the method in any one of the second aspect or the possible implementations of the second aspect.

DETAILED DESCRIPTION

The following describes the technical solutions in the embodiments of this application with reference to accompanying drawings of the embodiments of this application.

The embodiments of this application may be applied to various communications systems. Therefore, the following descriptions are not limited to a particular communications system. For example, the communications system may be a Global System for Mobile Communications (GSM), a Code Division Multiple Access (CDMA) system, a Wideband Code Division Multiple Access (WCDMA) system, a general packet radio service (GPRS) system, a Long Term Evolution (LTE) system, an LTE frequency division duplex (FDD) system, an LTE time division duplex (TDD) system, or a Universal Mobile Telecommunications System (UMTS). All information or data encoded by a base station or a terminal in the foregoing system by using a conventional turbo code and LDPC code can be encoded by using a polar code in the embodiments.

The base station may be a device for communication with the terminal. For example, the base station may be a base transceiver station (BTS) in a GSM or CDMA system, or may be a NodeB (NB) in a WCDMA system, or may be an evolved NodeB (eNB or eNodeB) in an LTE system. Alternatively, the base station may be a relay node, an access point, an in-vehicle device, a wearable device, a network-side device in a future 5G network, or the like.

The terminal may communicate with one or more core networks through a radio access network (RAN). The terminal may be user equipment (UE), an access terminal, a subscriber unit, a subscriber station, a mobile station, a mobile console, a remote station, a remote terminal, a mobile device, a user terminal, a wireless communications device, a user agent, or a user apparatus. The access terminal may be a cellular phone, a cordless phone, a Session Initiation Protocol (SIP) phone, a wireless local loop (WLL) station, a personal digital assistant (PDA), a handheld device having a wireless communication function, a computing device, another processing device connected to a wireless modem, an in-vehicle device, a wearable device, a terminal in a future 5G network, or the like.

Figure 1:
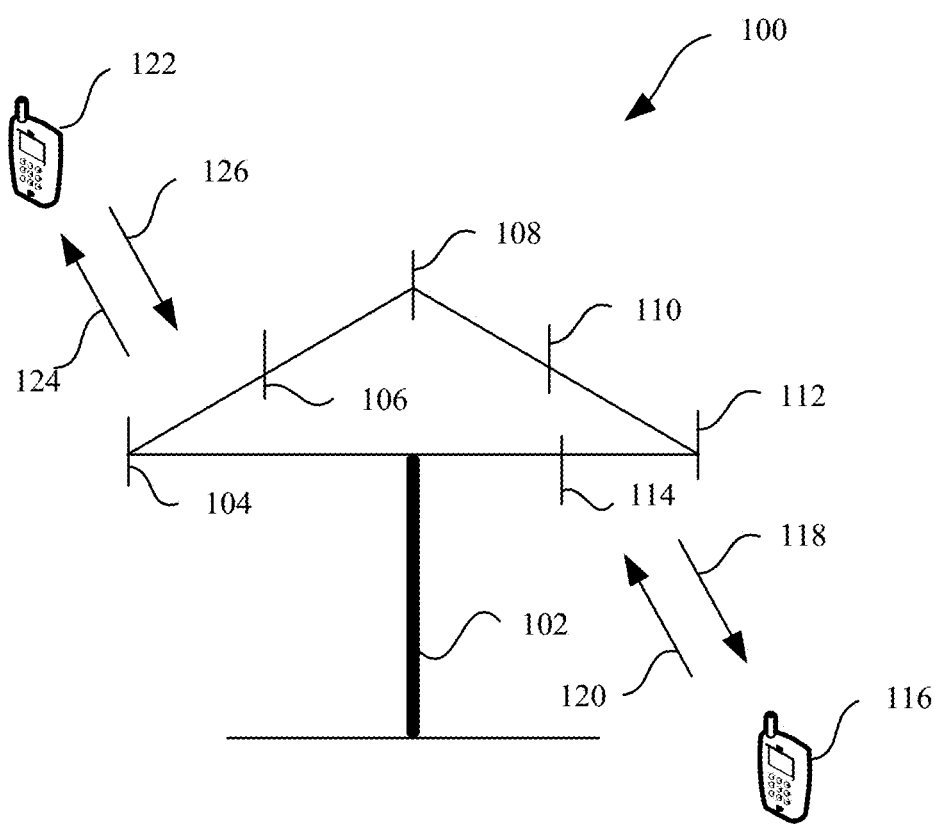
FIG. 1 is a schematic diagram of an application scenario according to an embodiment of this application.

FIG. 1 shows a wireless communications system 100 according to the embodiments of this specification. The system 100 includes a base station 102, and the base station 102 may include a plurality of antenna groups. For example, one antenna group may include an antenna 104 and an antenna 106, another antenna group may include an antenna 108 and an antenna 110, and an additional group may include an antenna 112 and an antenna 114. Two antennas are shown for each antenna group; however, each group may have more or fewer antennas. The base station 102 may additionally include a transmitter chain and a receiver chain. A person of ordinary skill in the art may understand that the transmitter chain and the receiver chain each may include a plurality of components, such as a processor, a modulator, a multiplexer, a demodulator, a demultiplexer, or an antenna related to signal transmission and reception.

The base station 102 may communicate with one or more access terminals, such as an access terminal 116 and an access terminal 122. However, it may be understood that the base station 102 may communicate with almost any quantity of access terminals similar to the access terminal 116 and the access terminal 122. The access terminal 116 and the access terminal 122 may be, for example, cellular phones, smartphones, portable computers, handheld communications devices, handheld computing devices, satellite radio apparatuses, devices related to the Global Positioning Systems, PDAs, and/or any other appropriate devices used for communication in the wireless communications system 100. As shown in the figure, the access terminal 116 communicates with the antenna 112 and the antenna 114. The antenna 112 and the antenna 114 send information to the access terminal 116 through a forward link 118, and receive information from the access terminal 116 through a reverse link 120. In addition, the access terminal 122 communicates with the antenna 104 and the antenna 106. The antenna 104 and the antenna 106 send information to the access terminal 122 through a forward link 124, and receive information from the access terminal 122 through a reverse link 126. In a frequency division duplex (FDD) system, for example, the forward link 118 may use a frequency band different from that used by the reverse link 120, and the forward link 124 may use a frequency band different from that used by the reverse link 126. In addition, in a time division duplex (TDD) system, the forward link 118 and the reverse link 120 may use a same frequency band, and the forward link 124 and the reverse link 126 may use a same frequency band.

Each antenna group or each area or both designed for communication are referred to as sectors of the base station 102. For example, the antenna group may be designed to communicate with an access terminal in a sector in a coverage area of the base station 102. During communication through the forward link 118 and the forward link 124, a transmit antenna of the base station 102 may increase signal-to-noise ratios of the forward link 118 for the access terminal 116 and the forward link 124 for the access terminal 122 through beamforming. In addition, compared with a case in which a base station performs sending to all access terminals of the base station by using a single antenna, when the base station 102 performs, through beamforming, sending to the access terminal 116 and the access terminal 122 that are randomly scattered in the related coverage area, less interference is caused to a mobile device in a neighboring cell.

At a given time, the base station 102, the access terminal 116, and/or the access terminal 122 may be wireless communications sending apparatuses and/or wireless communications receiving apparatuses. When sending data, a wireless communications sending apparatus may encode the data for transmission. Specifically, the wireless communications sending apparatus may have (for example, generate, obtain, or store in a memory) a specific quantity of information bits that need to be sent to the wireless communications receiving apparatus over a channel. The information bits may be included in a transport block or a plurality of transport blocks of data, and the transport block may be segmented to generate a plurality of code blocks. In addition, the wireless communications sending apparatus may encode each code block by using a polar encoder, so as to improve data transmission reliability, thereby ensuring communication quality.

Figure 2:
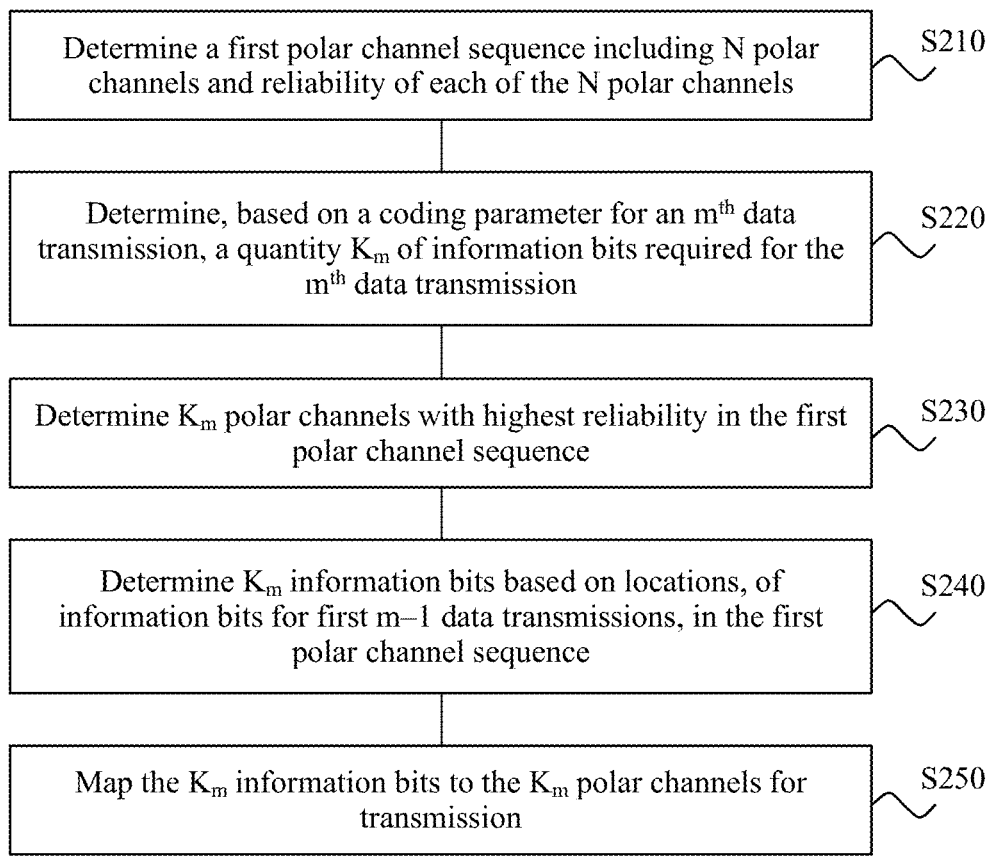
FIG. 2 is a schematic flowchart of a polar code retransmission method according to an embodiment of this application.

FIG. 2 is a schematic flowchart of a polar code retransmission method 200 according to an embodiment of this application. The method 200 may be applied to the wireless communications system 100 in FIG. 1. However, this embodiment of this application is not limited thereto. In addition, the method 200 may be performed by a network device, or may be user equipment. As shown in FIG. 2, the method 200 includes the following steps:

S210. Determine a first polar channel sequence including N polar channels and reliability of each of the N polar channels.

S220. Determine, based on a coding parameter for an $m^{th}$ data transmission, a quantity $K_m$ of information bits that need to be transmitted during the $m^{th}$ data transmission, where the coding parameter includes at least one of the quantity of information bits and a code rate.

S230. Determine $K_m$ polar channels with highest reliability in the first polar channel sequence.

S240. Determine $K_m$ information bits based on locations, of information bits that need to be transmitted during first m−1 data transmissions, in the first polar channel sequence.

S250. Map the $K_m$ information bits to the $K_m$ polar channels for transmission.

Herein, m, $K_m$, and N are positive integers, m is greater than 1, and $K_m$ is less than N.

Specifically, a transmit device may determine the first polar channel sequence based on the reliability of each of the N polar channels, and adjust information bits based on the first polar channel sequence during each subsequent data transmission. In addition, before each data transmission, the transmit device first needs to determine a coding parameter for this data transmission. It should be understood that the coding parameter may include at least one of the following parameters: a code length (which may also be referred to as a quantity of encoded bits), a quantity of information bits, and a code rate. After determining the coding parameter for this transmission, the transmit device determines, based on the coding parameter, a quantity $K_m$ of information bits that need to be transmitted, and then selects corresponding $K_m$ polar channels and $K_m$ information bits to perform mapping and transmission. In this embodiment of this application, when performing the $m^{th}$ data transmission, the transmit device determines $K_m$ information bits used for the $m^{th}$ data transmission, and maps the $K_m$ information bits to $K_m$ polar channels with highest reliability for encoding and transmission.

In this way, the $K_m$ polar channels used for the $m^{th}$ data transmission are all selected based on the first polar channel sequence. To be specific, a polar channel sequence occupied by information bits that need to be transmitted during a second data transmission is a sub-sequence of the first polar channel sequence, a polar channel sequence occupied by information bits that need to be transmitted during a third data transmission is also a sub-sequence of the first polar channel sequence, and so on. A polar channel sequence occupied by information bits that need to be transmitted during each subsequent retransmission is a sub-sequence determined based on the first polar channel sequence.

It should be understood that data transmissions may require a same quantity of information bits or different quantities of information bits. For example, when m=2, a quantity of information bits that need to be transmitted during a second data transmission is $K_2$; when m=3, a quantity of information bits that need to be transmitted during a third data transmission is $K_3, \ldots$, where $K_2$ and $K_3$ may be equal or not equal. In an implementation, $K_3$ is less than $K_2$, in other words, for the $m^{th}$ data transmission, $K_m$ is less than $K_{m-1}$. However, this embodiment of this application is not limited thereto.

It should be further understood that, before an initial data transmission is performed, the transmit device may obtain the reliability of each of the N polar channels, and when performing a subsequent retransmission, the transmit device selects at least one polar channel with highest reliability based on the previously obtained reliability of each polar channel. Specifically, the reliability of the polar channels may be calculated through density evolution (DE) or Gaussian approximation (GA).

Therefore, according to the polar code retransmission method in this embodiment of this application, the same polar channel sequence is used during each data transmission, and the determined $K_m$ information bits are directly mapped to the $K_m$ polar channels with highest reliability in the polar channel sequence for transmission, without recalculating the reliability of the polar channels before each retransmission. This can reduce retransmission complexity and improve transmission performance, thereby improving user experience.

That the transmit device needs to perform the $m^{th}$ data transmission means that after the $(m-1)^{th}$ data transmission is performed, the transmit device needs to perform the $m^{th}$ data transmission after a receive device fails to decode data transmitted during the $(m-1)^{th}$ transmission. Specifically, the transmit device may acknowledge, according to received negative acknowledgement (NACK) information, that the receive device fails to decode the data.

It should be understood that m is not equal to 1, and the foregoing embodiment represents each retransmission process. During an initial transmission, if the transmit device is user equipment, the user equipment may determine information such as a code rate and a quantity of information bits that need to be transmitted during the transmission by receiving scheduling information of a base station, for example, by receiving indication information sent by the base station. The indication information may include a modulation and coding scheme (MCS) and a quantity of resource blocks (RBs). The transmit device determines the code rate, a quantity of encoded bits, and the quantity of information bits that need to be transmitted during the initial transmission based on the indication information. In another case without scheduling, the transmit device obtains the foregoing coding parameter based on information such as an available transmission resource, an agreed code rate, and a modulation order.

In an optional embodiment, the reliability of each polar channel is a polarization weight of the polar channel.

Specifically, the polarization weight is a broad concept, and is not limited to a single construction method. For different polar code construction manners, different methods are used for calculating a polarization weight. This is not limited in this embodiment of this application.

In a specific implementation, for a polar code with a code length of 2 raised to the power of n, that is, $N=2^n$, N to-be-encoded bits include information bits and frozen bits. First, it is determined, based on the code length N, that there are N polar channels in total with channel sequence numbers 0 to N−1. The polar channel sequence numbers are used as parameters, to perform operations sequentially, and calculate a polarization weight W of each of the N polar channels. All the polar channels are sorted in descending order of the polarization weights, the first $K_m$ polar channels are selected, and sequence numbers of the first $K_m$ polar channels are used as a location set for placing the $K_m$ information bits (to-be-encoded bits). After the $K_m$ information bits are placed in the previously selected location set, bits on other locations are set as frozen bits, to obtain a complete to-be-encoded bit sequence with a length of N. Finally, an encoding process of the to-be-encoded bit sequence is completed by using an encoding matrix $G_N$ of the polar code.

Specifically, the first polarization weight vector is obtained by calculating the polarization weights $W_i$ of the N polar channels according to the following formula:

$$W_i = \sum_{j=0}^{n-1} B_j * (2^j + \phi)^\alpha,$$

where $i \triangleq B_{n-1} B_{n-2} \ldots B_0$, i is a channel index, $B_{n-1} B_{n-2} \ldots B_0$ is a binary representation of i, $B_{n-1}$ is a most significant bit, $B_0$ is a least significant bit, $B_j \in \{0,1\}$, $j \in \{0, 1, \ldots, n-1\}$, $i \in \{0, 1, \ldots, n-1\}$, $N=2^n$, $\phi$ and $\alpha$ are parameters preset based on a target code length of a first data transmission and a code rate of the first data transmission, and n is a positive integer.

In an optional embodiment, the first polar channel sequence is generated by sorting the N polar channels based on the reliability of each of the N polar channels.

Specifically, after obtaining the reliability of each of the N polar channels, the transmit device may sort the N polar channels based on the reliability of each polar channel. The sorting may be performed in ascending order or in descending order of reliability. This is not limited in this embodiment of this application. After rankings of the reliability of the N polar channels are determined, the determined information bits may be directly mapped to polar channels with highest rankings for transmission during each retransmission. In this way, the transmit device does not need to determine a reliability value of each of the N polar channels during each transmission, but only needs to obtain the first polar channel sequence obtained after the N polar channels are sorted based on reliability values. This reduces complexity and improves coding efficiency.

In an optional embodiment, m is 2, and the $K_m$ information bits are information bits that occupy $K_m$ polar channels with lowest reliability in the first polar channel sequence during the first data transmission.

Specifically, during a retransmission, the transmit device may select information bits transmitted on polar channels with lowest reliability during the first data transmission, and select $K_m$ information bits that are corresponding to the polar channels with lowest reliability to perform the retransmission. In this way, a decoding success rate of the receive device can be increased, and a quantity of retransmissions of the transmit device can be reduced.

In an optional embodiment, a code rate of the first data transmission is R, and a code rate of the $m^{th}$ data transmission is $$\frac{R}{m},$$

where R is greater than 0 and less than 1.

The determining $K_m$ information bits based on locations, of information bits that need to be transmitted during first m−1 data transmissions, in the first polar channel sequence includes:

determining $K_{m-1}$ polar channels, corresponding to information bits that need to be transmitted during an $(m-1)^{th}$ data transmission, in the first polar channel sequence, where $K_{m-1}$ is less than N and greater than $K_m$;

determining $$\left\lceil \frac{K_m}{m-1} \right\rceil$$

polar channels with lowest reliability from the $K_{m-1}$ polar m−1 channels; and determining the $K_m$ information bits from information bits on the $$\left\lceil \frac{K_m}{m-1} \right\rceil$$

polar channels during each of the first m−1 data transmissions.

Specifically, before performing the $m^{th}$ data transmission, the transmit device may first determine the information bits used during the $(m-1)^{th}$ data transmission, determine the polar channels occupied by these information bits in the first polar channel sequence during the $(m-1)^{th}$ data transmission, determine the $$\left\lceil \frac{K_m}{m-1} \right\rceil$$

polar channels with lowest reliability from these polar channels, and then select the $K_m$ information bits from information bits mapped to the $$\left\lceil \frac{K_m}{m-1} \right\rceil$$

polar channels during each of the first m−1 data transmissions, to perform the $m^{th}$ data transmission.

For example, if the transmit device is to perform a third data transmission, and a quantity of information bits that need to be transmitted during a first transmission is 12, according to a regularity of a code rate, a quantity of information bits that need to be transmitted during the third data transmission is 4, and is corresponding to four polar channels with highest reliability. The transmit device may first select six information bits that need to be transmitted during a second data transmission, then determine six polar channels corresponding to the six information bits, determine two polar channels with lowest reliability from the six polar channels, and then use two information bits transmitted on the two polar channels during the first data transmission and two information bits transmitted on the two polar channels during the second data transmission as four information bits that need to be transmitted during the third data transmission.

It should be understood that, when $K_m$ is indivisible by m−1, $$\left\lceil \frac{K_m}{m-1} \right\rceil$$

polar channels first need to be determined; then, $$\left\lceil \frac{K_m}{m-1} \right\rceil \times (m-1)$$

information bits mapped to the $$\left\lceil \frac{K_m}{m-1} \right\rceil$$

polar channels during each of the first m−1 data transmissions are determined, where $$\left\lceil \frac{K_m}{m-1} \right\rceil \times (m-1)$$

is greater than $K_m$; and finally, $K_m$ information bits are selected from the $$\left\lceil \frac{K_m}{m-1} \right\rceil \times (m-1)$$

information bits as information bits, for the $m^{th}$ data transmission, mapped to the $K_m$ polar channels. Optionally, an information bit on a polar channel with low reliability may be selected based on locations, occupied by the $$\left\lceil \frac{K_m}{m-1} \right\rceil \times (m-1)$$

information bits, in the first polar channel sequence during a previous data transmission. This is not limited in this embodiment of this application.

Therefore, information bits corresponding to most unreliable polar channels during all previous data transmissions are comprehensively considered, and the information bits are mapped to polar channels with highest reliability for retransmission, so as to enhance reliability of these most unreliable information bits, and increase a decoding success rate.

It should be understood that rankings of the $K_m$ information bits on the $K_m$ polar channels with highest reliability in the first polar channel sequence are not unique, and may be rankings of the $K_m$ information bits used during the first transmission, or may be any other rankings. This is not limited in this embodiment of this application.

In an optional embodiment, the mapping the $K_m$ information bits to the $K_m$ polar channels for transmission includes:

sorting the $K_m$ information bits in descending order of reliability of the polar channels corresponding to the $K_m$ information bits that need to be transmitted during the first data transmission; and mapping, for transmission, the sorted $K_m$ information bits to the $K_m$ polar channels ranked in descending order of reliability.

Specifically, during each retransmission, the $K_m$ information bits may be mapped, in descending order of the reliability of the polar channels occupied by the $K_m$ information bits during the first data transmission, to the $K_m$ polar channels ranked in descending order of reliability.

Figure 3:
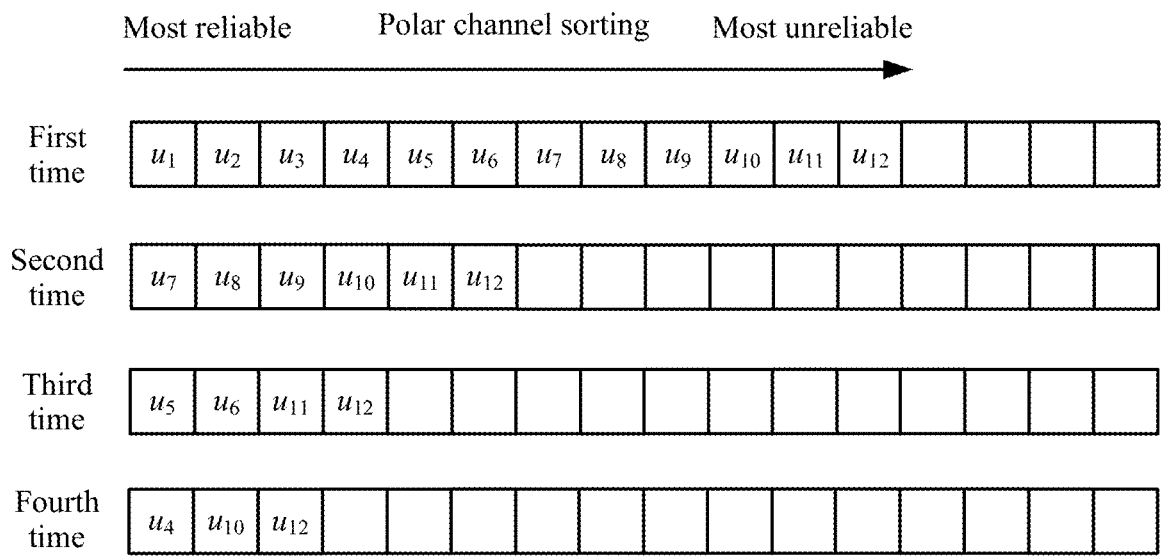
FIG. 3 is a schematic flowchart of another polar code retransmission method according to an embodiment of this application.

Specifically, FIG. 3 is a schematic flowchart of another polar code retransmission method according to an embodiment of this application. As shown in FIG. 3, a first data transmission, a second data transmission, a third data transmission, and a fourth data transmission are included from top to bottom.

Before the first data transmission, the transmit device may separately calculate reliability of 16 polar channels, and sort the 16 polar channels from left to right in descending order of reliability.

During the first data transmission, the transmit device may determine 12 information bits based on a code rate R of the first data transmission, add sequence numbers corresponding to 12 polar channels (12 polar channels counting from the left) that have highest reliability rankings into a set $A_1$, and respectively transmit, on the 12 polar channels represented by the set $A_1$, the 12 information bits: $u_1$, $u_2$, ..., and $u_{12}$.

During the second data transmission, the transmit device may add, based on a code rate R/2 of the second data transmission, sequence numbers corresponding to six polar channels that have highest reliability rankings into a set $A_2$, and further determine information bits mapped to $A_1\backslash A_2=\{a_i|a_i\in A_1, a_i\notin A_2\}$ channels during the first data transmission, that is, $u_7$, $u_8$, $u_9$, $u_{10}$, $u_{11}$, and $u_{12}$. The information bits $u_7$, $u_8$, $u_9$, $u_{10}$, $u_{11}$, and $u_{12}$ are separately mapped to the polar channels represented by the set $A_2$ for transmission.

The determined code rate of the second data transmission is R/2 because when there is no feedback information from the receive device, it is expected that a code rate of each transmission is obtained through even division. For example, when the code rate of the initial transmission is R, half of information bits are used for retransmission in the first retransmission, and after one retransmission, the code rates of the initial transmission and the first retransmission are R/2. When channel quality of the initial transmission and channel quality of the first retransmission are the same, this policy of evenly dividing a code rate can ensure that decoding success rates for the two transmissions are the same, preventing a case in which decoding fails due to an excessively high code rate of one transmission. Likewise, a code rate of each subsequent data transmission may be determined.

Likewise, during the third data transmission, the transmit device may add, based on a code rate R/3 of the third data transmission, sequence numbers corresponding to four polar channels that have highest reliability rankings into a set $A_3$, further determine information bits $u_5$ and $u_6$ mapped to $A_2\backslash A_3=\{a_i|a_i\in A_2, a_i\notin A_3\}$ channels during the first data transmission and information bits $u_{11}$ and $u_{12}$ mapped to $A_2\backslash A_3=\{a_i|a_i\in A_2, a_i\notin A_3\}$ channels during the second data transmission, and finally separately map an information bit sequence $u_5, u_6, u_{11}, u_{12}$ to the polar channels represented by the set $A_3$ for transmission.

During the fourth data transmission, the transmit device may add, based on a code rate R/4 of the fourth data transmission, sequence numbers corresponding to three polar channels that have highest reliability rankings into a set $A_4$, further determine an information bit $u_4$ mapped to an $A_3\backslash A_4=\{a_i|a_i\in A_3, a_i\notin A_4\}$ channel during the first data transmission, an information bit $u_{10}$ mapped to an $A_3\backslash A_4=\{a_i|a_i\in A_3, a_i\notin A_4\}$ channel during the second data transmission, and an information bit $u_{12}$ mapped to an $A_3\backslash A_4=\{a_i|a_i\in A_3, a_i\notin A_4\}$ channel during the third data transmission, and finally separately map an information bit sequence $u_4, u_{10}, u_{12}$ to the polar channels represented by the set $A_4$ for transmission.

During each retransmission, information bits are mapped to the first polar channel sequence strictly in an order of information bits that need to be transmitted during the first data transmission. FIG. 3 is used as an example. If the order of the information bits that need to be transmitted during the first transmission is $u_1, u_2, \ldots$, and $u_{12}$, an order of information bits that need to be transmitted during the second transmission is $u_7, u_8, u_9, u_{10}, u_{11}$, and $u_{12}$, an order of information bits that need to be transmitted during the third transmission is $u_5, u_6, u_{11}$, and $u_{12}$, and an order of information bits that need to be transmitted during the fourth transmission is $u_4, u_{10}$, and $u_{12}$. However, it should be understood that this is not limited in this embodiment of this application, and a subsequent retransmission may be performed in any other order. For example, the order of the information bits that need to be transmitted during the second transmission is $u_{12}, u_{11}, \ldots$, and $u_1$, the order of the information bits that need to be transmitted during the third transmission is $u_{11}, u_{12}, u_9$, and $u_6$, and the order of the information bits that need to be transmitted during the fourth transmission is $u_4, u_{10}$, and $u_{12}$. This is not limited in this embodiment of this application.

It should be understood that a coding parameter for each data transmission may be fixed or may be adaptively changed. This is not limited in this embodiment of this application. Specifically, the transmit device may determine, in a plurality of manners, the coding parameter for each data transmission.

In an optional embodiment, the determining the coding parameter for the $m^{th}$ data transmission includes:

determining a preset coding parameter as the coding parameter for the $m^{th}$ data transmission.

Specifically, the preset coding parameter may be agreed on by the transmit device and the receive device in advance, or may be determined based on feedback information sent by the receive device. In short, the preset coding parameter is fixed or is determined according to a specific rule. In a specific implementation, if the code rate of the initial transmission is R, and the receive device and the transmit device agree on a rule of a code rate of each retransmission in advance, the code rate of the second transmission is $$\frac{R}{2},$$

the code rate of the third transmission is $$\frac{R}{3},$$

..., and a code rate of the $m^{th}$ transmission is $$\frac{R}{m}.$$

In an optional embodiment, the determining the coding parameter for the $m^{th}$ data transmission includes:

receiving feedback information sent by the receive device for the $(m-1)^{th}$ data transmission; and determining the coding parameter for the $m^{th}$ data transmission based on the feedback information for the $(m-1)^{th}$ data transmission.

In other words, during a data retransmission, a code length, a retransmission code rate, or a quantity of information bits can be determined based on quality of a channel for a previous data transmission. The feedback information may include channel state information (CSI), a signal to interference plus noise ratio (SINR), or a channel quality indicator (CQI) in Long Term Evolution (LTE); or may include a code rate directly sent by the receive device; or may include a modulation and coding scheme (MCS), a transmission resource size, or the like. The coding parameter includes one or more parameters of a code length, a code rate, and a quantity of information bits.

It should be understood that a quantity of encoded bits is a code length. The two concepts are interchangeable in the embodiment of this application. It should be further understood that a quantity of information bits may be determined by using a code length and a code rate, or a code rate may be determined by using a code length and a quantity of information bits. In other words, a third parameter may be deduced by using only two of the three parameters. In addition, other information that can be used to instruct the transmit device to determine the coding parameter shall fall within the protection scope of the embodiments of this application.

Specifically, the feedback information may include a CQI or an SINR. The CQI is used as an example. There is a mapping table between a CQI and a code rate, so that the code rate may be determined by using the CQI. In other words, an actually allowed code rate on a channel during a previous transmission can be determined from the received feedback information, and when a transmission resource is unchanged, a code rate of a current retransmission can be determined based on a code rate that can be actually provided on a channel during the previous transmission. Further, because the transmission resource is unchanged, a code length is unchanged. Therefore, a quantity of information bits that are retransmitted this time may be determined by using the code rate and the code length.

Therefore, in this embodiment of this application, the transmit device can adjust, by using the feedback information sent by the receive device, a coding parameter such as a code rate, a code length, or a quantity of information bits, so as to adaptively change a code rate during a retransmission.

Figure 4:
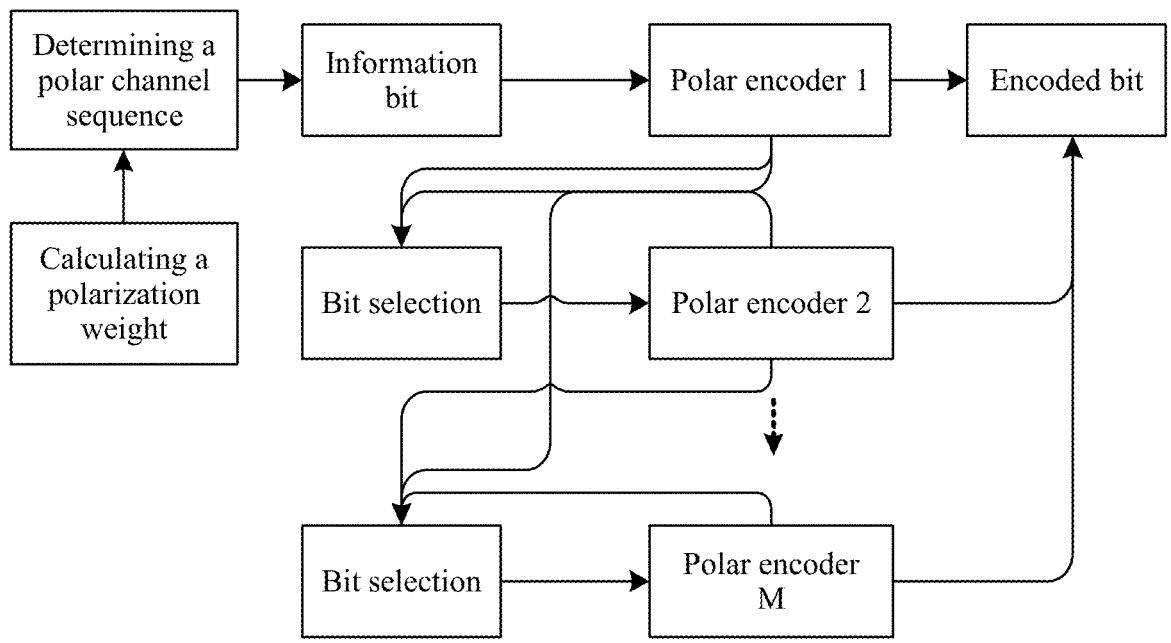
FIG. 4 is a schematic flowchart of another polar code retransmission method according to an embodiment of this application.

FIG. 4 is a schematic diagram of an encoder according to an embodiment of this application. As shown in FIG. 4, M is a maximum quantity of transmissions (including an initial transmission). Specifically, bits that are encoded again each time include some information bits during all previous data transmissions, and information bits selected each time are information bits that are restructured based on a current retransmission code rate and that are corresponding to polar channels with lower reliability during all the previous data transmissions. A specific process of selecting an information bit is the same as that in the method described in the foregoing embodiment. Details are not described herein again.

Figure 5:
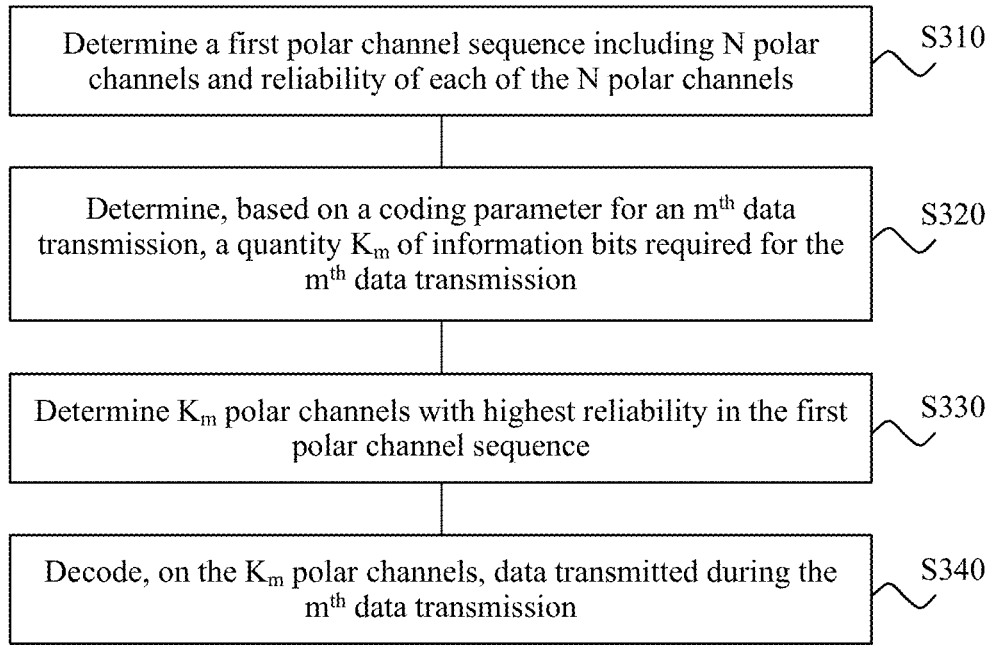
FIG. 5 is a schematic flowchart of another polar code retransmission method according to an embodiment of this application.

FIG. 5 is a schematic flowchart of a polar code retransmission method 300 according to an embodiment of this application. The method 300 may be applied to the wireless communications system 100 in FIG. 1. However, this embodiment of this application is not limited thereto. In addition, the method 300 may be performed by a network device, or may be user equipment. As shown in FIG. 3, the method 300 includes the following steps:

S310. Determine a first polar channel sequence including N polar channels and reliability of each of the N polar channels.

S320. Determine, based on a coding parameter for an $m^{th}$ data transmission, a quantity $K_m$ of information bits that need to be transmitted during the $m^{th}$ data transmission, where the coding parameter includes at least one of the quantity of information bits and a code rate.

S330. Determine $K_m$ polar channels with highest reliability in the first polar channel sequence.

S340. Decode, on the $K_m$ polar channels, data transmitted during the $m^{th}$ data transmission.

Herein, m, $K_m$, and N are positive integers, m is greater than 1, and $K_m$ is less than N.

Therefore, according to the polar code retransmission method in this embodiment of this application, during each data transmission, $K_m$ polar channels are directly determined by using the same polar channel sequence, and received data is directly decoded on the $K_m$ polar channels, without recalculating reliability of the polar channels before each reception of data retransmitted by a transmit device. This can reduce decoding complexity and improve transmission performance, thereby improving user experience.

In an optional embodiment, the first polar channel sequence is generated by sorting the N polar channels based on the reliability of each of the N polar channels.

In an optional embodiment, the method further includes:
sending feedback information to a transmit device, so that the transmit device determines the coding parameter for the $m^{th}$ data transmission based on the feedback information.

In an optional embodiment, the reliability of each polar channel is a polarization weight of the polar channel.

In an optional embodiment, before the determining a first polar channel sequence including N polar channels and reliability of each of the N polar channels, the method further includes:
calculating the polarization weight of each of the N polar channels.

In an optional embodiment, the calculating the polarization weight of each of the N polar channels includes:
obtaining the first polarization weight vector by calculating the polarization weights $W_i$ of the N polar channels according to the following formula:

$$W_i = \sum_{j=0}^{n-1} B_j * (2^j + \phi)^\alpha,$$

where $i \triangleq B_{n-1}B_{n-2} \ldots B_0$, i is a channel index, $B_{n-1}B_{n-2} \ldots B_0$ is a binary representation of i, $B_{n-1}$ is a most significant bit, $B_0$ is a least significant bit, $B_j \in \{0,1\}$, $j \in \{0, 1, \ldots, n-1\}$, $i \in \{0, 1, \ldots, n-1\}$, $N=2^n$, $\phi$ and $\alpha$ are parameters preset based on a target code length of a first data transmission and a code rate of the first data transmission, and n is a positive integer.

It should be understood that sequence numbers of the foregoing processes do not mean particular execution sequences. The execution sequences of the processes should be determined based on functions and internal logic of the processes, and should not be construed as any limitation on the implementation processes of the embodiments of this application.

The foregoing describes in detail the polar code retransmission method according to the embodiments of this application with reference to FIG. 1 to FIG. 5. The following describes in detail a polar code retransmission apparatus according to embodiments of this application with reference to FIG. 6 to FIG. 9.

Figure 6:
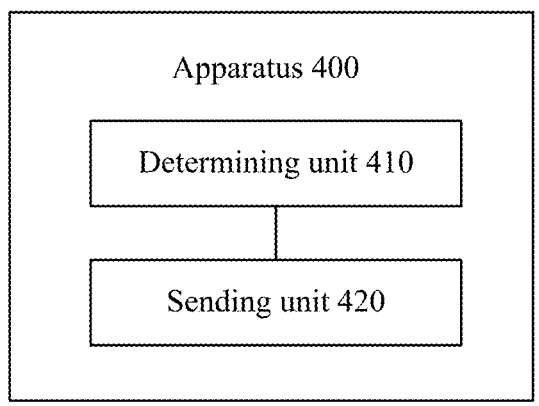
FIG. 6 is a schematic block diagram of a polar code retransmission apparatus according to an embodiment of this application.

FIG. 6 is a schematic block diagram of a polar code retransmission apparatus 400 according to an embodiment of this application. The apparatus 400 includes:

a determining unit 410, configured to: determine a first polar channel sequence including N polar channels and reliability of each of the N polar channels;

determine, based on a coding parameter for an $m^{th}$ data transmission, a quantity $K_m$ of information bits that need to be transmitted during the $m^{th}$ data transmission, where the coding parameter includes at least one of the quantity of information bits and a code rate;

determine $K_m$ polar channels with highest reliability in the first polar channel sequence; and determine $K_m$ information bits based on locations, of information bits that need to be transmitted during first m-1 data transmissions, in the first polar channel sequence; and a sending unit 420, configured to map the $K_m$ information bits to the $K_m$ polar channels for transmission, where m, $K_m$, and N are positive integers, m is greater than 1, and $K_m$ is less than N.

Therefore, according to the polar code retransmission apparatus in this embodiment of this application, the same polar channel sequence is used during each data transmission, and the determined $K_m$ information bits are directly mapped to the $K_m$ polar channels with highest reliability in the polar channel sequence for transmission, without recalculating the reliability of the polar channels before each retransmission. This can reduce retransmission complexity and improve transmission performance, thereby improving user experience.

Optionally, m is 2, and the $K_m$ information bits are information bits that occupy $K_m$ polar channels with lowest reliability in the first polar channel sequence during a first data transmission.

Optionally, a code rate of the first data transmission is R, and a code rate of the $m^{th}$ data transmission is $$\frac{R}{m},$$

where R is greater than 0 and less than 1. The determining unit is specifically configured to: determine $K_{m-1}$ polar channels, corresponding to information bits that need to be transmitted during an $(m-1)^{th}$ data transmission, in the first polar channel sequence, where $K_{m-1}$ is less than N and greater than $K_m$; determine $$\left\lceil \frac{K_m}{m-1} \right\rceil$$

polar channels with lowest reliability from the $K_{m-1}$ polar channels; and determine the $K_m$ information bits from information bits on the $$\left\lceil \frac{K_m}{m-1} \right\rceil$$

polar channels during each of the first m-1 data transmissions.

Optionally, the apparatus further includes: a sorting unit, configured to sort the $K_m$ information bits in descending order of reliability of the polar channels corresponding to the $K_m$ information bits that need to be transmitted during the first data transmission. The sending unit 420 is specifically configured to map, for transmission, the sorted $K_m$ information bits to the $K_m$ polar channels ranked in descending order of reliability.

Optionally, the determining unit 410 is further configured to: before determining, based on the coding parameter for the $m^{th}$ data transmission, the quantity $K_m$ of information bits that need to be transmitted during the $m^{th}$ data transmission, determine the coding parameter for the $m^{th}$ data transmission.

Optionally, the determining unit 410 is specifically configured to determine a preset coding parameter as the coding parameter for the $m^{th}$ data transmission.

Optionally, the apparatus further includes: a receiving unit, configured to receive feedback information sent by a receive device for the $(m-1)^{th}$ data transmission. The determining unit 410 is specifically configured to determine the coding parameter for the $m^{th}$ data transmission based on the feedback information for the $(m-1)^{th}$ data transmission.

Optionally, the first polar channel sequence is generated by sorting the N polar channels based on the reliability of each of the N polar channels.

Optionally, the reliability of each polar channel is a polarization weight of the polar channel.

Optionally, the apparatus further includes: a calculation unit, configured to: before the first polar channel sequence including the N polar channels and the reliability of each of the N polar channels are determined, calculate the polarization weight of each of the N polar channels.

Optionally, the calculation unit is specifically configured to obtain the first polarization weight vector by calculating the polarization weights $W_i$ of the N polar channels according to the following formula:

$$W_i = \sum_{j=0}^{n-1} B_j * (2^j + \phi)^\alpha,$$

where $i \triangleq B_{n-1}B_{n-2} \ldots B_0$, i is a channel index, $B_{n-1}B_{n-2} \ldots B_0$ is a binary representation of i, $B_{n-1}$ is a most significant bit, $B_0$ is a least significant bit, $B_j \in \{0,1\}$, $j \in \{0, 1, \ldots, n-1\}$, $i \in \{0, 1, \ldots, n-1\}$, $N=2^n$, $\phi$ and $\alpha$ are parameters preset based on a target code length of a first data transmission and a code rate of the first data transmission, and n is a positive integer.

It should be understood that the apparatus 400 herein is embodied in a form of functional units. The term "unit" herein may be an application-specific integrated circuit (application-specific integrated circuit, ASIC), an electronic circuit, a processor (for example, a shared processor, a dedicated processor, or a group processor) configured to execute one or more software or firmware programs and a memory, a combinational logic circuit, and another appropriate component that supports the described functions. In an optional example, a person skilled in the art may understand that the apparatus 400 may be specifically the transmit device in the foregoing embodiments, and the apparatus 400 may be configured to perform procedures and steps that are corresponding to the transmit device in the foregoing method embodiments. To avoid repetition, details are not described herein again.

Figure 7:
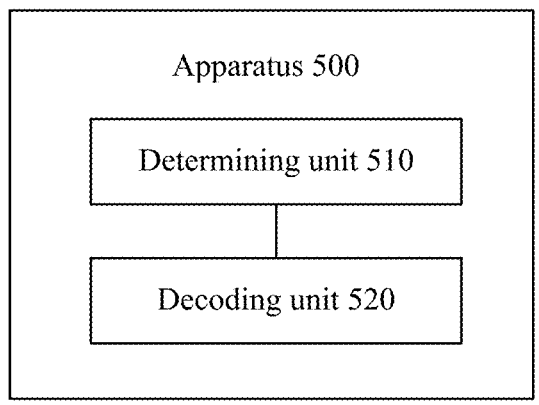
FIG. 7 is a schematic block diagram of another polar code retransmission apparatus according to an embodiment of this application.

FIG. 7 is a schematic block diagram of a polar code retransmission apparatus 500 according to an embodiment of this application. The apparatus 500 includes:

a determining unit 510, configured to: determine a first polar channel sequence including N polar channels and reliability of each of the N polar channels;

determine, based on a coding parameter for an $m^{th}$ data transmission, a quantity $K_m$ of information bits that need to be transmitted during the $m^{th}$ data transmission, where the coding parameter includes at least one of the quantity of information bits and a code rate; and determine $K_m$ polar channels with highest reliability in the first polar channel sequence; and a decoding unit 520, configured to decode, on the $K_m$ polar channels, data transmitted during the $m^{th}$ data transmission, where m, $K_m$, and N are positive integers, m is greater than 1, and $K_m$ is less than N.

Therefore, according to the polar code retransmission apparatus in this embodiment of this application, during each data transmission, $K_m$ polar channels are directly determined by using the same polar channel sequence, and received data is directly decoded on the $K_m$ polar channels, without recalculating reliability of the polar channels before each reception of data retransmitted by a transmit device. This can reduce decoding complexity and improve transmission performance, thereby improving user experience.

Optionally, the first polar channel sequence is generated by sorting the N polar channels based on the reliability of each of the N polar channels.

Optionally, the apparatus further includes:

a sending unit, configured to send feedback information to a transmit device, so that the transmit device determines the coding parameter for the $m^{th}$ data transmission based on the feedback information.

Optionally, the reliability of each polar channel is a polarization weight of the polar channel.

Optionally, the apparatus further includes: a calculation unit, configured to: before the first polar channel sequence including the N polar channels and the reliability of each of the N polar channels are determined, calculate the polarization weight of each of the N polar channels.

Optionally, the calculation unit is specifically configured to obtain the first polarization weight vector by calculating the polarization weights $W_i$ of the N polar channels according to the following formula:

$$W_i = \sum_{j=0}^{n-1} B_j * (2^j + \phi)^\alpha,$$

where $i \triangleq B_{n-1}B_{n-2} \ldots B_0$, i is a channel index, $B_{n-1}B_{n-2} \ldots B_0$ is a binary representation of i, $B_{n-1}$ is a most significant bit, $B_0$ is a least significant bit, $B_j \in \{0,1\}$, $j \in \{0, 1, \ldots, n-1\}$, $i \in \{0, 1, \ldots, n-1\}$, $N=2^n$, $\phi$ and $\alpha$ are parameters preset based on a target code length of a first data transmission and a code rate of the first data transmission, and n is a positive integer.

It should be understood that the apparatus 500 herein is embodied in a form of functional units. The term "unit" herein may be an application-specific integrated circuit (application-specific integrated circuit, ASIC), an electronic circuit, a processor (for example, a shared processor, a dedicated processor, or a group processor) configured to execute one or more software or firmware programs and a memory, a combinational logic circuit, and another appropriate component that supports the described functions. In an optional example, a person skilled in the art may understand that the apparatus 500 may be specifically the receive device in the foregoing embodiments, and the apparatus 500 may be configured to perform procedures and steps that are corresponding to the receive device in the foregoing method embodiments. To avoid repetition, details are not described herein again.

Figure 8:
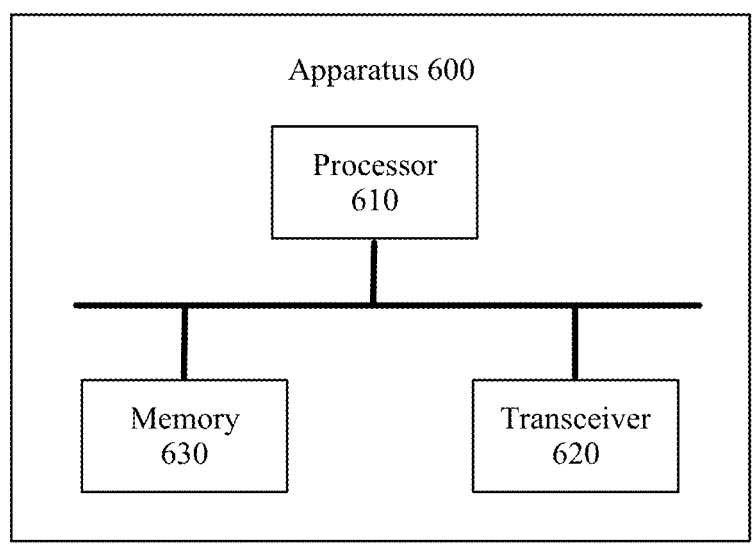
FIG. 8 is a schematic block diagram of another polar code retransmission apparatus according to an embodiment of this application.

FIG. 8 shows a polar code retransmission apparatus 600 according to an embodiment of this application. The apparatus 600 includes a processor 610, a transceiver 620, a memory 630, and a bus system 640. The processor 610, the transceiver 620, and the memory 630 are connected by using the bus system 640, the memory 630 is configured to store an instruction, and the processor 610 is configured to execute the instruction stored in the memory 630, to control the transceiver 620 to send a signal and receive a signal.

The processor 610 is configured to: determine a first polar channel sequence including N polar channels and reliability of each of the N polar channels; determine, based on a coding parameter for an $m^{th}$ data transmission, a quantity $K_m$ of information bits that need to be transmitted during the $m^{th}$ data transmission, where the coding parameter includes at least one of the quantity of information bits and a code rate; determine $K_m$ polar channels with highest reliability in the first polar channel sequence; determine $K_m$ information bits based on locations, of information bits that need to be transmitted during first m-1 data transmissions, in the first polar channel sequence; and instruct the transceiver 620 to map the $K_m$ information bits to the $K_m$ polar channels for transmission, where m, $K_m$, and N are positive integers, m is greater than 1, and $K_m$ is less than N.

It should be understood that the apparatus 600 may be specifically the transmit device in the foregoing embodiments, and may be configured to perform steps and/or procedures that are corresponding to the transmit device in the foregoing method embodiments. Optionally, the memory 630 may include a read-only memory and a random access memory, and provide an instruction and data for the processor. A part of the memory may further include a non-volatile random access memory. For example, the memory may further store information about a device type. The processor 610 may be configured to execute the instruction stored in the memory. When the processor executes the instruction stored in the memory, the processor is configured to perform the steps and/or the procedures that are corresponding to the transmit device in the foregoing method embodiments.

Figure 9:
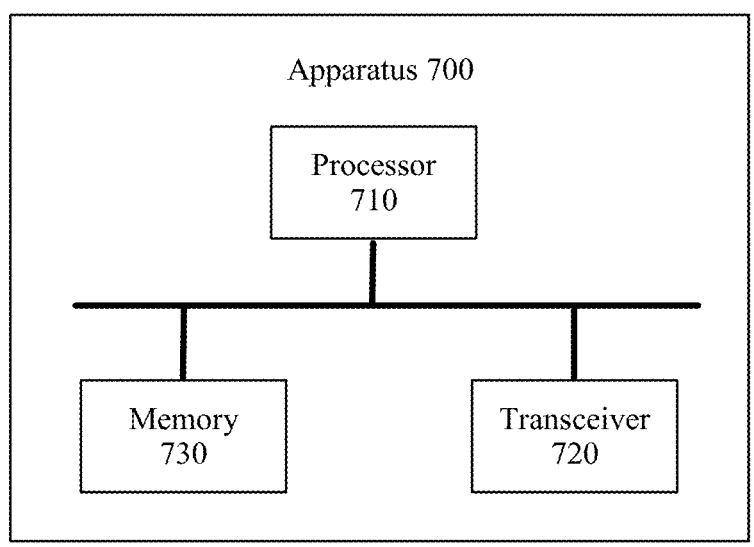
FIG. 9 is a schematic block diagram of another polar code retransmission apparatus according to an embodiment of this application.

FIG. 9 shows a polar code retransmission apparatus 700 according to an embodiment of this application. The apparatus 700 includes a processor 710, a transceiver 720, a memory 730, and a bus system 740. The processor 710, the transceiver 720, and the memory 730 are connected by using the bus system 740, the memory 730 is configured to store an instruction, and the processor 710 is configured to execute the instruction stored in the memory 730, to control the transceiver 720 to send a signal and receive a signal.

The processor 710 is configured to: determine a first polar channel sequence including N polar channels and reliability of each of the N polar channels; determine, based on a coding parameter for an $m^{th}$ data transmission, a quantity $K_m$ of information bits that need to be transmitted during the $m^{th}$ data transmission, where the coding parameter includes at least one of the quantity of information bits and a code rate; determine $K_m$ polar channels with highest reliability in the first polar channel sequence; and decode, on the $K_m$ polar channels, data transmitted during the $m^{th}$ data transmission, where m, $K_m$, and N are positive integers, m is greater than 1, and $K_m$ is less than N.

It should be understood that the apparatus 700 may be specifically the receive device in the foregoing embodiments, and may be configured to perform steps and/or procedures that are corresponding to the receive device in the foregoing method embodiments. Optionally, the memory 730 may include a read-only memory and a random access memory, and provide an instruction and data for the processor. A part of the memory may further include a nonvolatile random access memory. For example, the memory may further store information about a device type. The processor 710 may be configured to execute the instruction stored in the memory. When the processor executes the instruction stored in the memory, the processor is configured to perform the steps and/or the procedures that are corresponding to the receive device in the foregoing method embodiments.

It should be understood that in the embodiments of this application, the processor may be a central processing unit (CPU), or the processor may be another general purpose processor, a digital signal processor (DSP), an application-specific integrated circuit (ASIC), a field programmable gate array (FPGA) or another programmable logic device, a discrete gate or transistor logic device, a discrete hardware component, or the like. The general purpose processor may be a microprocessor, or the processor may be any conventional processor or the like.

In an implementation process, each step of the foregoing method may be completed by using an integrated logical circuit of hardware in the processor or an instruction in a form of software. The steps of the methods disclosed with reference to the embodiments of this application may be directly performed and completed by a hardware processor, or may be performed and completed by using a combination of hardware and software modules in the processor. A software module may be located in a mature storage medium in the art, such as a random access memory, a flash memory, a read-only memory, a programmable read-only memory, an electrically erasable programmable memory, a register, or the like. The storage medium is located in the memory, and the processor executes instructions in the memory and completes the steps in the foregoing methods in combination with hardware of the processor. To avoid repetition, details are not described herein again.

Figure 10:
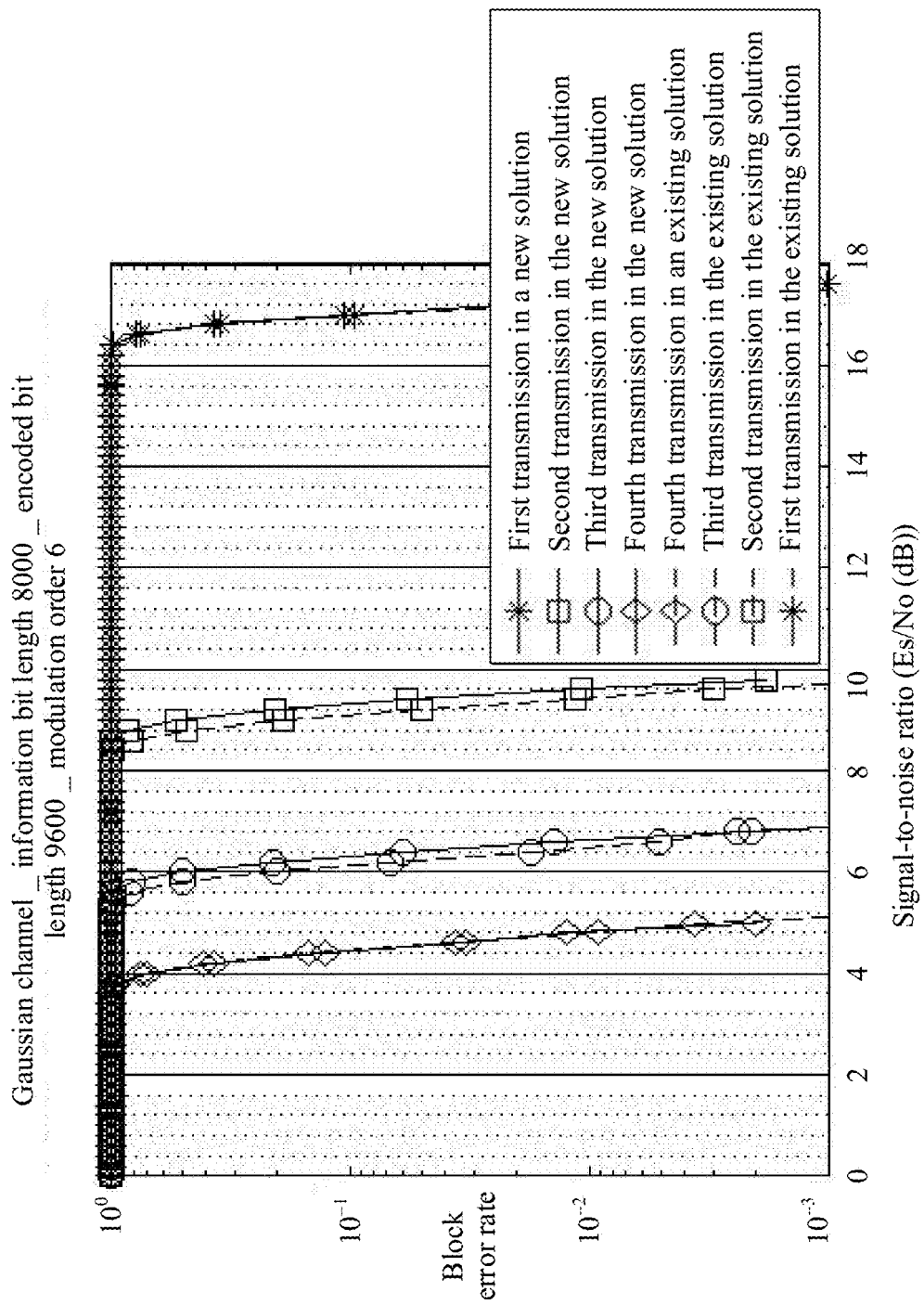
FIG. 10 is a schematic diagram of transmission performance of a polar code retransmission method according to an embodiment of this application.
Figure 11:
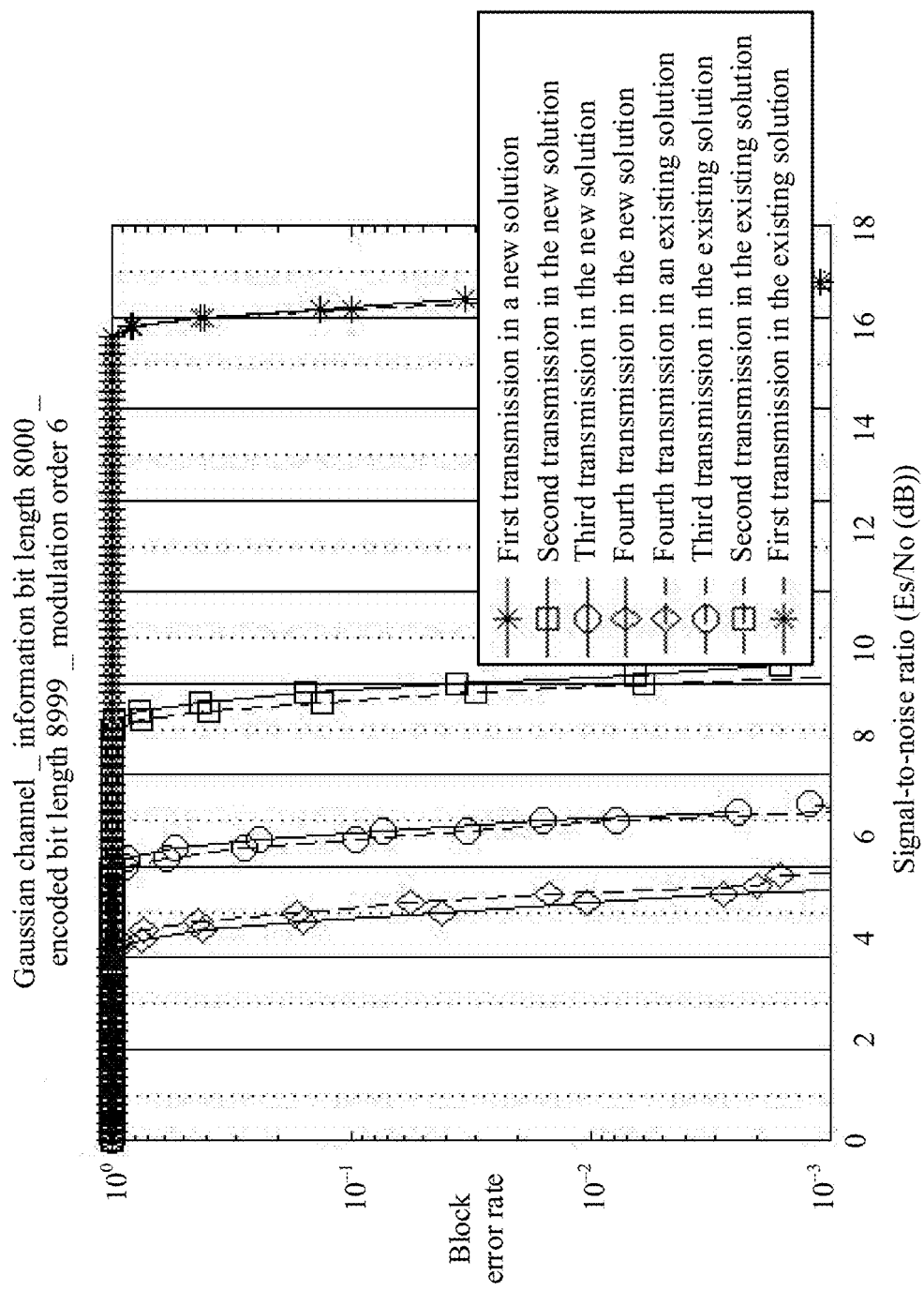
FIG. 11 is a schematic diagram of transmission performance of another polar code retransmission method according to an embodiment of this application.

FIG. 10 and FIG. 11 each are a schematic diagram of transmission performance of a polar code retransmission method according to an embodiment of this application.

In the retransmission method in the embodiments of this application, a polar channel sequence needs to be constructed only once. However, in a method used for comparison, for each HARQ retransmission, reliability of a polar channel needs to be calculated and a polar channel sequence needs to be reconstructed. The following gives specific parameters for simulation and comparison. The specific parameters are as follows: On an additive white Gaussian noise (AWGN) channel, a given code length is 8000, a code rate is 5/6 and 8/9, and a modulation order is 6.

FIG. 10 and FIG. 11 each show analog curves of four transmissions. It can be seen from the analog curves that performance of the technical solutions proposed in the embodiments of this application is close to performance of the prior art, and a performance difference falls within a range of 0.1 dB to 0.2 dB on the AWGN channel. However, the solutions proposed in the embodiments of this application are of low complexity, are easy to operate, and can improve transmission performance.

It should be understood that "one embodiment" or "an embodiment" mentioned in the whole specification means that particular features, structures, or characteristics related to the embodiment are included in at least one embodiment of this application. Therefore, "in one embodiment" or "in an embodiment" appearing throughout the specification does not refer to a same embodiment. Moreover, the particular characteristic, structure or property may be combined in one or more embodiments in any proper manner. It should be understood that sequence numbers of the foregoing processes do not mean particular execution sequences in various embodiments of this application. The execution sequences of the processes should be determined based on functions and internal logic of the processes, and should not be construed as any limitation on the implementation processes of the embodiments of this application.

In addition, the terms "system" and "network" may be used interchangeably in this specification. The term "and/or" in this specification describes only an association relationship for describing associated objects and represents that three relationships may exist. For example, A and/or B may represent the following three cases: Only A exists, both A and B exist, and only B exists. In addition, the character "/" in this specification usually indicates an "or" relationship between the associated objects.

It should be understood that in the embodiments of this application, "B corresponding to A" indicates that B is associated with A, and B may be determined based on A. However, it should be further understood that determining B based on A does not mean that B is determined based on A only; that is, B may also be determined based on A and/or other information.

A person of ordinary skill in the art may be aware that, the units and steps in the examples described with reference to the embodiments disclosed herein may be implemented by electronic hardware, computer software, or a combination thereof. To clearly describe the interchangeability between the hardware and the software, the foregoing has generally described compositions and steps of each example based on functions. Whether the functions are performed by hardware or software depends on particular applications and design constraint conditions of the technical solutions. A person skilled in the art may use different methods to implement the described functions for each particular application, but it should not be considered that the implementation goes beyond the scope of this application.

It may be clearly understood by a person skilled in the art that, for the purpose of convenient and brief description, for a detailed working process of the foregoing system, apparatus, and unit, refer to a corresponding process in the foregoing method embodiments, and details are not described herein.

In the several embodiments provided in this application, it should be understood that the disclosed system, apparatus, and method may be implemented in other manners. For example, the described apparatus embodiment is merely an example. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented through some interfaces, indirect couplings or communication connections between the apparatuses or units, or electrical connections, mechanical connections, or connections in other forms.

The units described as separate parts may or may not be physically separate, and parts displayed as units may or may not be physical units, may be located in one position, or may be distributed on a plurality of network units. Some or all of the units may be selected based on actual needs to achieve the objectives of the solutions of the embodiments of this application.

In addition, functional units in the embodiments of this application may be integrated into one processing unit, or each of the units may exist alone physically, or two or more units are integrated into one unit. The integrated unit may be implemented in a form of hardware, or may be implemented in a form of a software functional unit.

With descriptions of the foregoing implementations, a person skilled in the art may clearly understand that this application may be implemented by hardware, firmware or a combination thereof. When this application is implemented by software, the foregoing functions may be stored in a computer-readable medium or transmitted as one or more instructions or code in the computer-readable medium. The computer-readable medium includes a computer storage medium and a communications medium, where the communications medium includes any medium that enables a computer program to be transmitted from one place to another. The storage medium may be any available medium accessible to a computer. For example but not for limitation, the computer-readable medium may include a RAM, a ROM, an EEPROM, a CD-ROM, or another optical disc storage or disk storage medium, or another magnetic storage device, or any other medium that can carry or store expected program code in a form of an instruction or a data structure and can be accessed by a computer. In addition, any connection may be appropriately defined as a computer-readable medium. For example, if software is transmitted from a website, a server, or another remote source by using a coaxial cable, an optical fiber/cable, a twisted pair, a digital subscriber line (DSL), or wireless technologies such as infrared ray, radio, and microwave, the coaxial cable, optical fiber/cable, twisted pair, DSL, or wireless technologies such as infrared ray, radio, and microwave are included in a definition of the medium. As used in this application, disks (Disk) and discs (disc) include a compact disc (CD), a laser disc, an optical disc, a digital versatile disc (DVD), a floppy disk, and a Blu-ray disc. The disk usually copies data by a magnetic means, and the disc optically copies data by a laser means. The foregoing combination should also be included in the protection scope of the computer-readable medium.

In conclusion, the foregoing descriptions are merely examples of embodiments of the technical solutions of this application, but are not intended to limit the protection scope of this application. Any modification, equivalent replacement, or improvement made without departing from the principle of this application shall fall within the protection scope of this application.

What is claimed is:

1. A polar code retransmission method, the method comprising:
   determining a first polar channel sequence comprising N polar channels and reliability of each of the N polar channels;
   determining, based on a coding parameter for an $m^{th}$ data transmission, a quantity $K_m$ of information bits that need to be transmitted during the $m^{th}$ data transmission, wherein the coding parameter comprises at least one of the quantity of information bits and a code rate;
   determining $K_m$ polar channels with highest reliability in a first polar channel sequence;
   determining $K_m$ information bits based on locations, of information bits that need to be transmitted during first m−1 data transmissions, in the first polar channel sequence; and
   mapping the $K_m$ information bits to the $K_m$ polar channels for transmission;
   wherein m, $K_m$, and N are positive integers, m is greater than 1, and $K_m$ is less than N.

2. The method according to claim 1, wherein m is 2, and the $K_m$ information bits are information bits that occupy $K_m$ polar channels with lowest reliability in the first polar channel sequence during a first data transmission.

3. The method according to claim 1, wherein a code rate of the first data transmission is R, and a code rate of the $m^{th}$ data transmission is $$\frac{R}{m},$$

wherein R is greater than 0 and less than 1; and
   determining $K_m$ information bits based on locations, of information bits that need to be transmitted during first m−1 data transmissions, in the first polar channel sequence comprises:
      determining $K_{m-1}$ polar channels, corresponding to information bits that need to be transmitted during an $(m-1)^{th}$ data transmission, in the first polar channel sequence, wherein $K_{m-1}$ is less than N and greater than $K_m$;
      determining $$\left\lceil \frac{K_m}{m-1} \right\rceil$$

polar channels with lowest reliability from the $K_{m-1}$ polar channels; and
      determining the $K_m$ information bits from information bits on the $$\left\lceil \frac{K_m}{m-1} \right\rceil$$

polar channels during each of the first m−1 data transmissions.

4. The method according to claim 1, wherein mapping the $K_m$ information bits to the $K_m$ polar channels for transmission comprises:
   sorting the $K_m$ information bits in descending order of reliability of the polar channels corresponding to the $K_m$ information bits that need to be transmitted during the first data transmission; and
   mapping, for transmission, the sorted $K_m$ information bits to the $K_m$ polar channels ranked in descending order of reliability.

5. The method according to claim 1, wherein before determining, based on a coding parameter for an $m^{th}$ data transmission, a quantity $K_m$ of information bits that need to be transmitted during the $m^{th}$ data transmission, the method further comprises:

determining the coding parameter for the $m^{th}$ data transmission.

6. The method according to claim 5, wherein determining the coding parameter for the $m^{th}$ data transmission comprises:
determining a preset coding parameter as the coding parameter for the $m^{th}$ data transmission.

7. The method according to claim 5, wherein determining the coding parameter for the $m^{th}$ data transmission comprises:
receiving feedback information sent by a receive device for the $(m-1)^{th}$ data transmission; and
determining the coding parameter for the $m^{th}$ data transmission based on the feedback information for the $(m-1)^{th}$ data transmission.

8. The method according to claim 1, wherein the first polar channel sequence is generated by sorting the N polar channels based on the reliability of each of the N polar channels.

9. A polar code retransmission method, the method comprising:
determining a first polar channel sequence comprising N polar channels and reliability of each of the N polar channels;
determining, based on a coding parameter for an $m^{th}$ data transmission, a quantity $K_m$ of information bits that need to be transmitted during the $m^{th}$ data transmission, wherein the coding parameter comprises at least one of the quantity of information bits and a code rate;
determining $K_m$ polar channels with highest reliability in the first polar channel sequence; and
decoding, on the $K_m$ polar channels, data transmitted during the $m^{th}$ data transmission;
wherein m, $K_m$, and N are positive integers, m is greater than 1, and $K_m$ is less than N.

10. The method according to claim 9, wherein the first polar channel sequence is generated by sorting the N polar channels based on the reliability of each of the N polar channels.

11. The method according to claim 9, wherein the method further comprises:
sending feedback information to a transmit device for determining the coding parameter for the $m^{th}$ data transmission based on the feedback information.

12. The method according to claim 9, wherein the reliability of each polar channel is a polarization weight of the polar channel.

13. The method according to claim 12, wherein before determining a first polar channel sequence comprising of N polar channels and reliability of each of the N polar channels, the method further comprises:
calculating the polarization weight of each of the N polar channels.

14. The method according to claim 13, wherein calculating the polarization weights of the N polar channels comprises:
obtaining the first polarization weight vector by calculating the polarization weights $W_i$ of the N polar channels according to the following formula:

$$W_i = \sum_{j=0}^{n-1} B_j * (2^j + \phi)^\alpha,$$

where $i \triangleq B_{n-1}B_{n-2} \ldots B_0$, i is a channel index, $B_{n-1}B_{n-2} \ldots B_0$ is a binary representation of i, $B_{n-1}$ is a most significant bit, $B_0$ is a least significant bit, $B_j \in \{0,1\}$, $j \in \{0, 1, \ldots, n-1\}$, $i \in \{0, 1, \ldots, n-1\}$, $N=2^n$, $\phi$ and $\alpha$ are parameters preset based on a target code length of a first data transmission and a code rate of the first data transmission, and n is a positive integer.

15. A polar code retransmission apparatus, comprising:
a transceiver;
a memory, configured to store one or more instructions;
a processor, separately coupled to the memory and the transceiver, and configured to execute the one or more instructions stored in the memory to cause the apparatus to:
determine a first polar channel sequence comprising of N polar channels and reliability of each of the N polar channels;
determine, based on a coding parameter for an $m^{th}$ data transmission, a quantity $K_m$ of information bits that need to be transmitted during the $m^{th}$ data transmission, wherein the coding parameter comprises at least one of the quantity of information bits and a code rate;
determine $K_m$ polar channels with highest reliability in the first polar channel sequence; and
decode, on the $K_m$ polar channels, data transmitted during the $m^{th}$ data transmission;
wherein m, $K_m$, and N are positive integers, m is greater than 1, and $K_m$ is less than N.

16. The apparatus according to claim 15, wherein the first polar channel sequence is generated by sorting the N polar channels based on the reliability of each of the N polar channels.

17. The apparatus according to claim 15, wherein the transceiver is further configured to:
send feedback information to a transmit device for determining the coding parameter for the $m^{th}$ data transmission based on the feedback information.

18. The apparatus according to claim 15, wherein the reliability of each polar channel is a polarization weight of the polar channel.

19. The apparatus according to claim 18, wherein the processor is configured to execute the one or more instructions to cause the apparatus to:
before the first polar channel sequence comprising the N polar channels and the reliability of each of the N polar channels are determined, calculate the polarization weight of each of the N polar channels.

20. The apparatus according to claim 19, wherein the processor is configured to execute the one or more instructions to cause the apparatus to:
obtain a first polarization weight vector by calculating the polarization weights W of the N polar channels according to the following formula:

$$W_i = \sum_{j=0}^{n-1} B_j * (2^j + \phi)^\alpha,$$

where $i \triangleq B_{n-1}B_{n-2} \ldots B_0$, i is a channel index, $B_{n-1}B_{n-2} \ldots B_0$ is a binary representation of i, $B_{n-1}$ is a most significant bit, $B_0$ is a least significant bit, $B_j \in \{0,1\}$, $j \in \{0, 1, \ldots, n-1\}$, $i \in \{0, 1, \ldots, n-1\}$, $N=2^n$, $\phi$ and $\alpha$ are parameters preset based on a target code length of a first data transmission and a code rate of the first data transmission, and n is a positive integer.

* * * * *

UNITED STATES PATENT AND TRADEMARK OFFICE
CERTIFICATE OF CORRECTION

PATENT NO. : 10,574,401 B2  
APPLICATION NO. : 16/298901  
DATED : February 25, 2020  
INVENTOR(S) : Rong Li et al.

Page 1 of 1

It is certified that error appears in the above-identified patent and that said Letters Patent is hereby corrected as shown below:

In the Claims

Claim 20, Column 28, Line 55, "polarization weights W of the N polar channels accord-" please update the line to read "polarization weights $W_i$ of the N polar channels accord-"

Claim 20, Column 28, Line 63, "where $i \stackrel{\Delta}{=} B_{n-1} B_{n-2} \cdots B_0$, $i$" please update this portion of the line to read "wherein $i \stackrel{\Delta}{=} B_{n-1} B_{n-2} \cdots B_0$, $i$"

Signed and Sealed this  
Twenty-ninth Day of December, 2020

Andrei Iancu  
*Director of the United States Patent and Trademark Office*